(12) United States Patent
Tanis

(10) Patent No.: US 11,790,126 B2
(45) Date of Patent: Oct. 17, 2023

(54) METHOD AND SYSTEM FOR INTERNAL COMBUSTION ENGINE SIMULATION

(71) Applicant: Caterpillar Inc., Peoria, IL (US)

(72) Inventor: Derek A. Tanis, Peoria, IL (US)

(73) Assignee: Caterpillar Inc., Peoria, IL (US)

( * ) Notice: Subject to any disclaimer, the term of this patent is extended or adjusted under 35 U.S.C. 154(b) by 767 days.

(21) Appl. No.: 16/720,965

(22) Filed: Dec. 19, 2019

(65) Prior Publication Data

US 2021/0192104 A1    Jun. 24, 2021

(51) Int. Cl.
| | |
|---|---|
| *G06F 30/20* | (2020.01) |
| *F02D 43/04* | (2006.01) |
| *G06F 30/15* | (2020.01) |
| *F02D 41/14* | (2006.01) |

(52) U.S. Cl.
CPC ............ *G06F 30/20* (2020.01); *F02D 43/04* (2013.01); *G06F 30/15* (2020.01); *F02D 2041/1437* (2013.01)

(58) Field of Classification Search
CPC .......... G06F 30/20; G06F 30/15; F02D 43/04; F02D 2041/1437; F02D 41/2432; F02D 41/1401
USPC ............................................................. 703/8
See application file for complete search history.

(56) References Cited

U.S. PATENT DOCUMENTS

| | | | |
|---|---|---|---|
| 5,889,205 A * | 3/1999 | Treinies ............... | F02D 41/1401 73/114.32 |
| 7,013,250 B2 | 3/2006 | Hagiwara et al. | |
| 7,415,389 B2 * | 8/2008 | Stewart ................. | G05B 11/42 702/185 |
| 7,593,796 B2 | 9/2009 | Prokhorov | |
| 8,418,542 B2 | 4/2013 | Mayrhofer et al. | |
| 2003/0014179 A1 * | 1/2003 | Szukala ................ | G01M 15/05 701/115 |
| 2005/0085978 A1 * | 4/2005 | Remmlinger ....... | F02D 41/2435 701/54 |
| 2007/0156323 A1 * | 7/2007 | Urano ................. | G01M 15/046 701/113 |

(Continued)

FOREIGN PATENT DOCUMENTS

| | | |
|---|---|---|
| CN | 101807361 B | 12/2011 |
| CN | 102331721 B | 9/2013 |

(Continued)

*Primary Examiner* — Logan M Kraft
*Assistant Examiner* — Joshua Campbell
(74) *Attorney, Agent, or Firm* — Bookoff McAndrews, PLLC

(57) ABSTRACT

A method for generating data for an internal combustion engine control unit includes receiving at least one constraint by a simulated internal combustion engine, receiving a first value of an air condition by the simulated internal combustion engine, and determining at least one simulated engine parameter associated with a maximum expected output of the simulated internal combustion engine, wherein the maximum expected output is determined based on the first value and the at least one constraint. The method also includes supplementing existing engine information by storing the at least one simulated engine parameter in a memory associated with the internal combustion engine control unit together with the existing engine information.

13 Claims, 3 Drawing Sheets

(56) References Cited

U.S. PATENT DOCUMENTS

| | | | | |
|---|---|---|---|---|
| 2007/0265805 | A1* | 11/2007 | Lee | G01M 15/05 |
| | | | | 73/114.61 |
| 2010/0042393 | A1* | 2/2010 | Kruse | G05B 13/042 |
| | | | | 703/7 |
| 2014/0067231 | A1* | 3/2014 | Mosher | F02D 43/04 |
| | | | | 701/1 |
| 2016/0117427 | A1* | 4/2016 | Lindgärde | G06F 30/20 |
| | | | | 703/8 |

FOREIGN PATENT DOCUMENTS

| | | |
|---|---|---|
| CN | 102360332 B | 11/2013 |
| CN | 107748830 A | 3/2018 |
| CN | 109839279 A | 6/2019 |
| EP | 3091212 A1 * | 11/2016 ............ F02B 37/183 |
| JP | 2008-151118 A | 7/2008 |

* cited by examiner

METHOD AND SYSTEM FOR INTERNAL COMBUSTION ENGINE SIMULATION

TECHNICAL FIELD

The present disclosure relates generally to systems for internal combustion engines, and more particularly, to methods and systems for generating and using data associated with an internal combustion engine.

BACKGROUND

Internal combustion engine systems frequently include a control system including one or more engine control units that control various aspects of the engine. These control units operate in conjunction with sensors and maps that detect the operating conditions of the engine to help control the engine system. More recently, control units have been designed with models that use sensor information, maps, and other information to predict how an engine will perform under certain conditions and select an appropriate control of the engine system. The models may include empirical data collected from actual internal combustion engine systems operating under various conditions. However, physical testing under some engine conditions, is difficult, costly, and/or time consuming. In particular, physical testing may be particularly limited when collecting data to determine a maximum output of the engine without violating one or more limits. Therefore, data representing optimal engine output may be lacking for various conditions. This can hinder the ability of the model to accurately predict engine performance under such conditions, which may compromise engine control under these operating conditions.

An apparatus for determining engine torque is disclosed in U.S. Pat. No. 7,593,796 (the '796 patent) to Prokhorov et al. The apparatus described in the '796 patent estimates torque of a physical engine based on crankshaft rotation data of the engine. The rotation data may be provided to a neural network which can be trained to estimate this torque. While the apparatus described in the '796 patent may be useful in some circumstances, the disclosed apparatus may require significant amounts of training with a physical test vehicle equipped with a torque sensor. Additionally, the apparatus described in the '796 patent may be unable to determine an optimized or maximum output or torque.

The disclosed method and system may solve one or more of the problems set forth above and/or other problems in the art. The scope of the current disclosure, however, is defined by the attached claims, and not by the ability to solve any specific problem.

SUMMARY

In one aspect, a method for generating data for an internal combustion engine control unit may include receiving at least one constraint by a simulated internal combustion engine, receiving a first value of an air condition by the simulated internal combustion engine, and determining at least one simulated engine parameter associated with a maximum expected output of the simulated internal combustion engine, wherein the maximum expected output is determined based on the first value and the at least one constraint. The method may also include supplementing existing engine information by storing the at least one simulated engine parameter in a memory associated with the internal combustion engine control unit together with the existing engine information.

In another aspect, a method for generating data for an internal combustion engine model may include receiving at least one emissions constraint by an internal combustion engine simulator, receiving a first value of an engine condition with the internal combustion engine simulator, and determining at least one simulated engine parameter associated with a maximum expected acceleration with the internal combustion engine simulator, wherein the at least one simulated engine parameter is determined based on at least the first value and the at least one constraint. The method may also include storing the at least one simulated engine parameter as a part of the data for the internal combustion engine model, the data for the internal combustion engine model including at least one existing engine parameter associated with a physical test engine.

In yet another aspect, a control unit programming system may include at least one processor and a memory storing instructions that, when executed by the at least one processor, cause the programming system, cause the control unit programming system to receive at least one constraint by a simulated internal combustion engine. The instructions may also cause the programming system to: receive a first value of an air condition of the simulated internal combustion engine, the engine condition corresponding to a simulated condition of the simulated internal combustion engine, and determine at least one simulated engine parameter associated with a maximum expected output of the simulated internal combustion engine, wherein the maximum expected output is determined based on the first value and the at least one constraint. Additionally, the instructions may cause the programming system to store the at least one simulated engine parameter in a memory accessible by an internal combustion engine model together with at least one existing engine parameter.

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

DETAILED DESCRIPTION

Both the foregoing general description and the following detailed description are exemplary and explanatory only and are not restrictive of the features, as claimed. As used herein, the terms "comprises," "comprising," "having," including," or other variations thereof, are intended to cover a non-exclusive inclusion such that a process, method, article, or apparatus that comprises a list of elements does not include only those elements, but may include other elements not expressly listed or inherent to such a process, method, article, or apparatus. Moreover, in this disclosure, relative terms, such as, for example, "about," "substantially," "generally," and "approximately" are used to indicate a possible variation of ±10% in the stated value. As used herein, "programming," "configuring," and "storing" each includes creating, rewriting, updating, and/or modifying a program or information, including adding or supplementing information.

Figure 1:
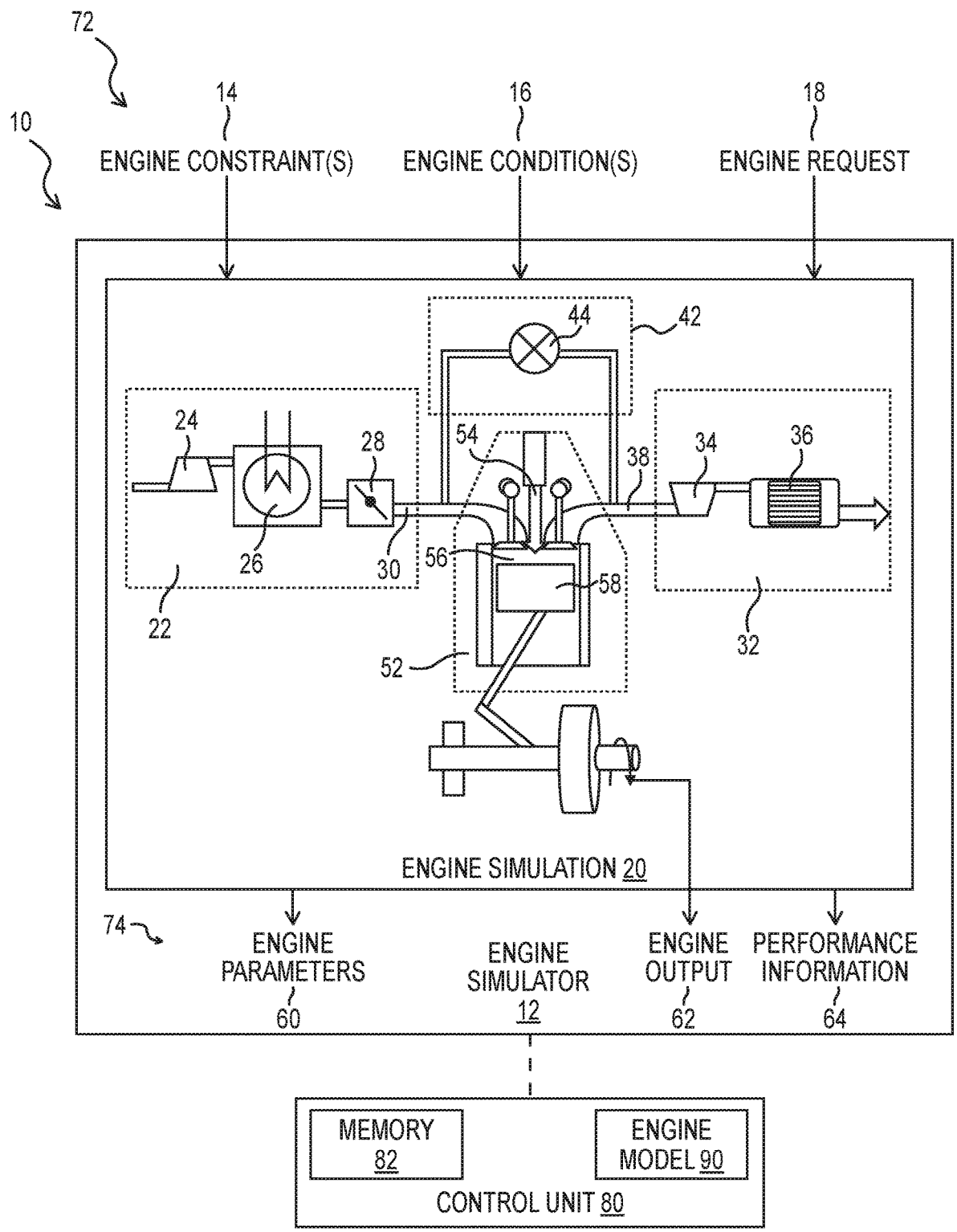
FIG. 1 is a schematic diagram illustrating a control unit programming system according to an aspect of the present disclosure.

FIG. 1 is a schematic diagram illustrating an exemplary control unit programming system 10 useful for programming a control unit or engine control unit 80. Programming system 10 may include an engine simulator 12 that executes an engine simulation 20 that may receive inputs 72 and outputs 74 when simulating an internal combustion engine. Inputs 72 may include engine constraints 14, engine conditions 16, and an engine simulation request 18. Outputs 74 may include engine parameters 60, one or more expected engine outputs 62, and engine performance information 64.

Engine simulator 12 may be any suitable computational device for simulating the performance of an internal combustion engine, including one or more computing systems, storage devices, etc. Engine simulation 20 may include, or may be implemented as one or more programs stored in memory associated with engine simulator 12 that allow engine simulator 12 to predict the operation of an actual internal combustion engine. Engine simulation 20 may include plurality of different modules useful in calculating outputs 74, such as an intake module 22, an exhaust module 32, an exhaust gas recirculation (EGR) module 42, and a power or combustion module 52. Each of the modules 22, 32, 42, 52 of engine simulation 20 may represent a respective system or component of an actual internal combustion engine. Engine simulation 20 may be configured to provide engine output 62 based on inputs 72 and simulated components of each of the modules 22, 32, 42, and 52. Engine control unit 80 may be in communication with engine simulator 12 and may include a memory 82 and an engine model 90.

Inputs 72 to engine simulation 20 may be provided by a user, may be predetermined, or may include a combination of user-provided and predetermined information. Engine constraints 14 of simulator inputs 72 may correspond to physical and/or operational limits of the simulated engine, such as a maximum or minimum operating temperature, maximum or minimum engine speed, maximum or minimum in-cylinder pressure, maximum or minimum fuel rate, or other characteristics of the simulated engine that represent one or more hard limits on engine performance. Constraints 14 may also be based on a limit (e.g., a desired limit) associated with one or more items of engine performance information 64. Engine performance information 64 may represent a state of one or more engine components, such as an in-cylinder pressure, a state of an aftertreatment device, or an amount of one or more emitted substances, such as an amount of soot, hydrocarbons, carbon monoxide, or other components. Constraints 14, such as an emissions constraint, may include one or more numerical values or limits input or set by a user. Additionally or alternatively, constraints 14 may be input by a user by selecting a description (e.g., emission constraints for Tier 4 diesel engine standards). While constraints 14 may be input, adjusted, or otherwise set by a user, one or more constraints 14 may be stored as one or more predetermined values in a memory of engine simulator 12. These predetermined constraints 14 may be retrieved based on a particular module or component present in simulation 20, for example. Constraints 14 may include at least one emissions constraint that corresponds to an expected quantity of a component contained in an exhaust emission. Engine conditions 16 may include one or more performance conditions that correspond to an environment in which the simulated engine operates. Conditions 16 may include, for example, an intake air pressure condition 116 (FIG. 2) such as an intake manifold absolute pressure (IMAP). Conditions 16 may include, in addition to air pressure condition 116, an engine speed condition 118 (FIG. 2), or other conditions such as ambient air temperature, atmospheric pressure, etc. One or more engine conditions 16, such as a particular IMAP, may set by a user, or may be set by an automated routine associated with engine simulation 20 that evaluates multiple values of a particular condition 16. Engine request 18 may correspond to a solution or optimization requested from engine simulation 20. For example, engine request 18 may include a request for a maximum output, such as a maximum expected amount of torque, power, and/or acceleration produced from this torque or power.

Intake module 22 may be configured to simulate one or more components associated with the introduction of intake air to one or more combustion chambers 56. Intake module 22 may include simulated components such as a compressor 24, an intake air cooler 26, and/or an intake throttle valve (ITV) 28. Intake module 22 may also simulate an intake passage or intake manifold 30, which represents a passage by which intake air of a particular mass flow rate, temperature, and pressure (e.g., IMAP), is provided for combustion. Exhaust module 32 may simulate one or more components associated with an exhaust and/or aftertreatment system. Exhaust module 32 may include a turbine 34 associated with compressor 24 and/or one or more aftertreatment devices 36 (diesel particulate filters, catalysts, etc.), as well as an exhaust manifold 38. An EGR module 42 related to the intake module 22 and exhaust module 32, may include a simulated EGR valve 44 for simulating a position of a device that controls an amount of exhaust gas recirculated to an intake system. The intake module 22, exhaust module 32, and EGR module 42, may each be associated with a combustion module 52. Combustion module 52 may simulate a power-generating unit of an internal combustion engine, including one or more simulated fuel injectors 54, combustion chambers 56, and pistons 58.

Engine simulation 20 may provide, as outputs 74, a set of engine parameters 60, an engine output 62 that may be produced by the corresponding set of engine parameters 60, and a plurality of items of engine performance information 64 that represent performance of the simulated engine. Engine parameters 60 may represent control signals that, when output to controllable components of an actual engine, cause the engine to produce engine output 62. Thus, parameters 60 may include commands or values associated with one or more of the components of simulated modules 22, 32, 42, 52. Engine parameters 60 associated with intake module 22 may include, for example, ITV position. Engine parameters 60 associated with exhaust and EGR modules 32, 42 may include position of a vane of a variable geometry turbine (VGT) and EGR valve position, respectively. Engine parameters 60 associated with combustion module 52 may include a fuel delivery parameter, such as a start of injection timing (SOI), start of injection pressure (SOIP, e.g., a fuel rail pressure at a beginning of injection), injection strategies (e.g., number of injection events per engine cycle, presence of a plot injection, post injection, etc.), injection duration, and mass of injected fuel, among others. Engine output 62 may indicate the expected amount of torque, power, or both, output by combustion module 52. Engine output 62 may include an acceleration, instead of or in addition to torque or power. Engine performance information 64 may indicate the state of the components of the engine, when the engine is operated based on engine parameters 60. Therefore, each set of engine parameters 60 may be associated with a particular engine output and a particular set of engine performance information 64.

Engine simulator 12 may be configured to create, update, and/or supplement data for an engine model 90 configured to control an actual engine. Engine model 90 may be stored in any suitable memory, such as memory 82 associated with an engine control unit 80. Engine control unit 80 may be any suitable device for controlling an internal combustion engine including one or more computing systems, storage devices, processors, etc. Numerous commercially available microprocessors can be configured to perform the functions of engine control unit 80. Various other known circuits may be associated with engine control unit 80, including signal-conditioning circuitry, communication circuitry, and other appropriate circuitry useful for interfacing with engine simulator 12. Engine simulator 12 may be in communication with engine control unit 80 through any suitable method, including one or more wired or wireless data connections. Engine simulator 12 may also be configured to program or otherwise communicate with engine control unit 80 in an asynchronous manner, e.g., by storing an engine model 90 in a removable storage medium that is provided to engine control unit 80 to provide or update engine model 90 in engine control unit 80. Additionally or alternatively, engine model 90 may be stored in a memory of engine simulator 12, or in an external memory and/or computing system.

Engine model 90 may correspond to any suitable model that allows engine control unit 80 to issue commands to components of an actual engine to control the engine. For example, engine model 90 may include a mean value model, or other suitable model. A mean value model may be, for example, a simplified model of the actual engine simulated by engine simulation 20. This mean value model may allow engine control unit 80 to predict the performance of this engine in real-time or near real-time. Engine model 90 may be derived from one or more empirical relationships, control maps, or any other suitable information that allow engine control unit 80 to control an engine based on detected or calculated operating conditions, which may correspond to engine conditions 16 evaluated by engine simulation 20. One or more of these relationships, maps, or other existing engine information may include information obtained without the use of an engine simulation. For example, existing engine information stored in memory 82 for engine model 90 may include information obtained by using a physical test engine. This existing engine information may be supplemented and/or adjusted based on the results of engine simulation 20, by storing data obtained from engine simulation 20, such as engine parameters 60, engine output 62, or engine performance information 64, within memory 82 of engine control unit 80. For example, existing engine parameters and existing engine performance information stored in memory 82 (e.g., data or information obtained by testing a physical test engine) may be supplemented by engine parameters 60, engine output 62, and/or performance information 64 from engine simulation 20. Engine model 90 may itself be stored in memory 82 or any suitable memory of engine control unit 80.

While engine simulation 20 has been described with modules 22, 32, 42, and 52 that simulate particular components of an actual engine, simulation 20 may include different components or modules, additional components or modules, or omit components or modules, as desired, to represent an actual engine. For example, modules 22 and 32 may be modified to include a plurality of compressors and turbines for a multi-turbocharged engine, or module 42 may be omitted for an engine that does not include EGR functionality.

INDUSTRIAL APPLICABILITY

Control unit programming system 10 may be used to configure a control unit, such as engine control unit 80, for use with any appropriate machine or vehicle that includes an internal combustion engine. For example, engine simulator 12 of system 10 may be any suitable computing or processing device configured to simulate a performance of an actual internal combustion engine and store information to calibrate, program, or supplement an engine model 90, based on the simulation. When engine control unit 80 is calibrated, programmed, or supplemented in this manner, for example by storing information in memory 82, engine control unit 80 may control an actual engine having the same or similar characteristics as those represented in engine simulation 20.

Engine simulator 12 may be configured to perform an optimization routine or search (via a suitable algorithm) that allows engine simulator 12 to search for a plurality of engine parameters 60 in response to request 18 (e.g., parameters 60 that provide maximum output) while satisfying each constraint 14. During this search, one or more of the engine conditions 16 may be applied to simulation 20. Engine simulator 12 may evaluate combinations or sets of potential values of parameters 60, and calculate corresponding sets or combinations of performance information 64. Each set of performance information 64 may be compared to engine constraints 14 to determine if any constraint has been exceeded. Engine simulator 12 may perform this process repeatedly to identify a set of engine parameters 60 that satisfies every constraint 14. One or more sets of engine parameters 60 that satisfy constraints 14 may be compared to determine an optimal set of parameters 60, a set that would produce the maximum output, thereby satisfying request 18. The engine parameters 60 that produce the maximum output 62 while satisfying each constraint 14 may then be used to create, update, and/or supplement information associated with engine model 90.

Figure 2:
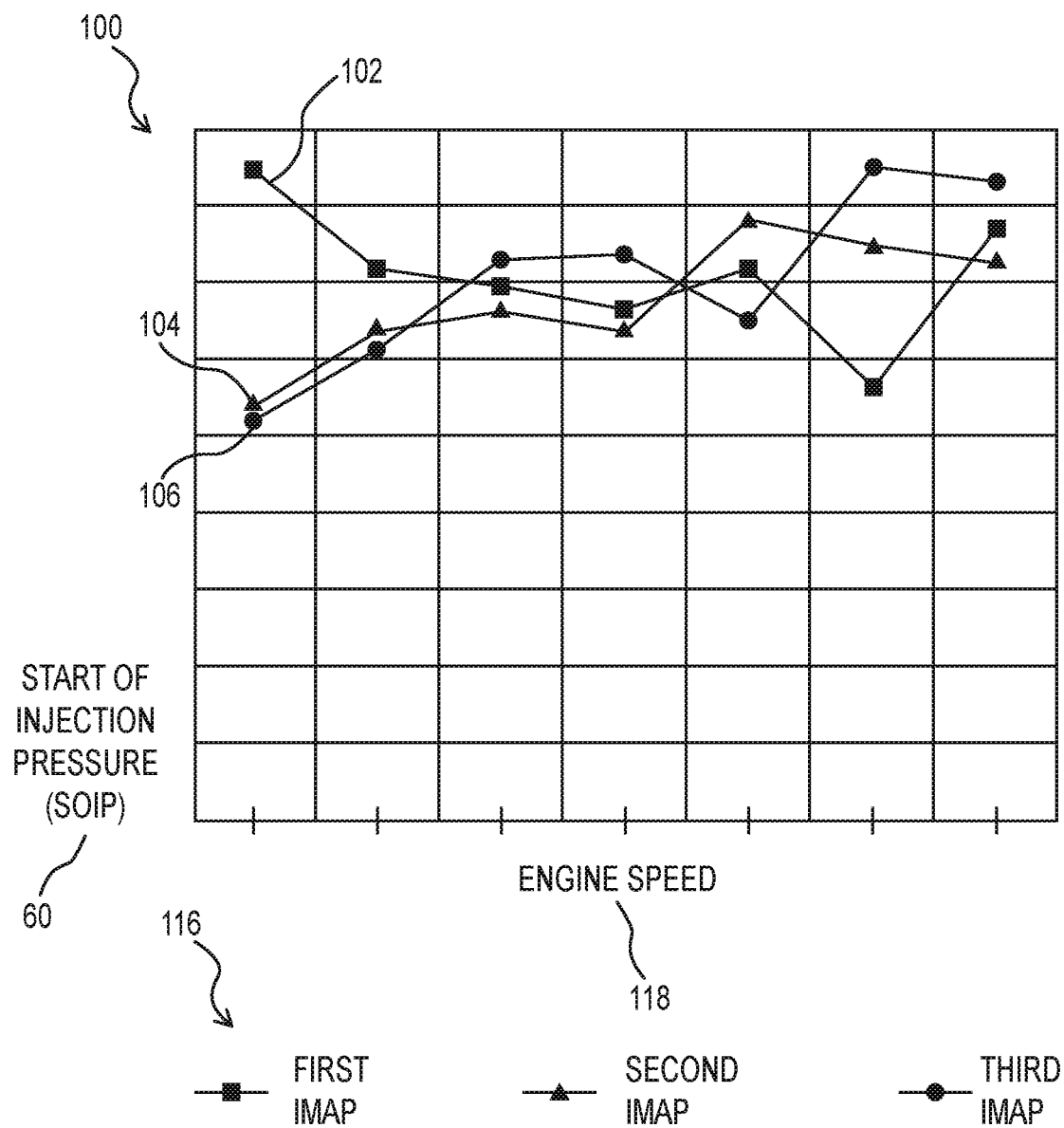
FIG. 2 is a chart illustrating engine conditions and parameters associated with an engine simulation of the control unit programming system of FIG. 1.

FIG. 2 is a chart illustrating exemplary results of a search for an optimal set of engine parameters 60 in response to a request 18 for maximum output. The results may be produced when engine simulation conditions 16 are applied, (e.g., air pressure condition 116 and/or engine speed condition 118). In one aspect, condition 16 may include a particular value, such as a first pressure condition 102 (e.g., IMAP of about 100 kPa, or less), a second pressure condition 104 (e.g., IMAP of about 150 kPa), or a third pressure condition 106 (e.g., IMAP of about 200 kPa, or more). In FIG. 2, the horizontal axis represents values of engine speed condition 118, and the vertical axis represents values of an exemplary engine parameter 60, start of injection pressure (SOIP). In this example, each SOIP data point represents an optimal SOIP parameter 60 that, in combination with other optimal parameters 60, provides the maximum possible engine output 62 while satisfying each constraint 14.

Engine conditions 16 may be set or forced to a particular state for engine simulation 20 (rather than allowing the values of one or more conditions, such as intake air pressure, to fluctuate). Considering, for example, a first data point associated with first pressure condition 102, engine simulator 12 may determine that a relatively high SOIP provides a maximum expected engine output 62. This determination may include evaluating, by simulation, a plurality of different potential values for SOIP, as well as a plurality of different values for other engine parameters 60 (e.g., ITV position, VGT vane position, EGR valve position, SOI, injection strategies, injection duration, mass of injected fuel, etc.). As can be seen, by changing or setting condition 116 to different IMAP values, different optimal values of parameters 60, such as a SOIP parameter, will achieve a maximum engine output 62. As understood, a plurality of engine parameters 60 identified as an optimal set of these parameters may change based on a change in one or more engine conditions 16.

Figure 3:
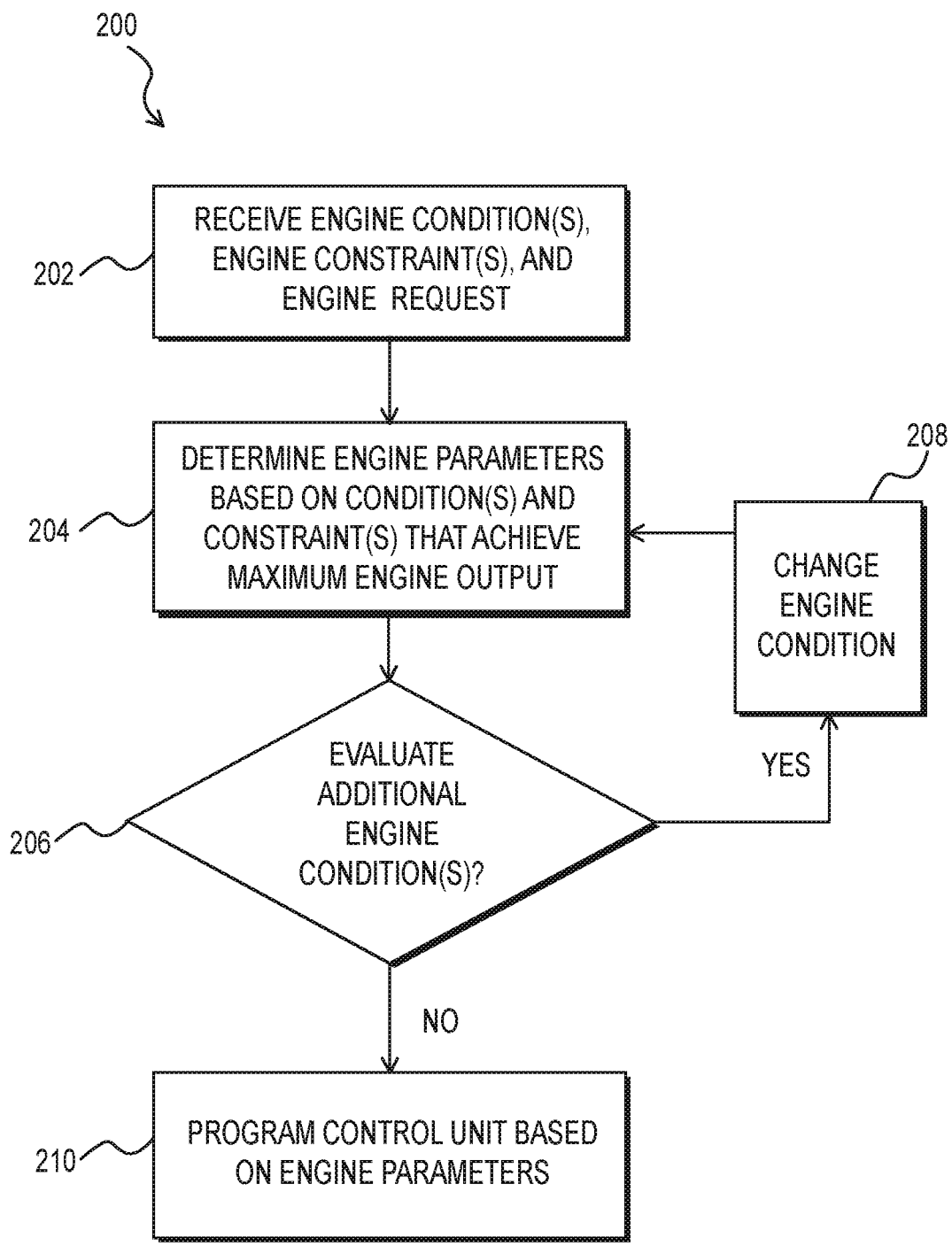
FIG. 3 is a flowchart of an exemplary method for programming a control unit of an internal combustion engine.

FIG. 3 illustrates a flowchart of an exemplary method 200 for generating data to be stored on an internal combustion engine control unit 80, and programming the engine control unit 80, based on engine parameters 60 determined with engine simulation 20. In some aspects, the entirety of method 200 may be performed to determine a maximum expected output (e.g., acceleration) without operating a physical internal combustion engine. In a step 202 of method 200, engine constraints 14, engine conditions 16, and an engine request 18 may be received by engine simulation 20 via engine simulator 12. Information corresponding to constraints 14, conditions 16, and request 18 may be retrieved from a memory associated with engine simulator 12, may be provided by a user input, or any combination thereof. In one aspect, a user may input, or otherwise specify, one or more engine constraints 14, and/or an engine condition 16. For example, a user may specify a particular value of air pressure condition 116 or specify a state of air pressure condition 116 (e.g., low pressure, average pressure, high pressure, etc.), as described above.

Step 204 may include calculating or determining engine parameters 60 that satisfy request 18, by evaluating a plurality of different possible combinations, or sets, of engine parameters 60. These parameters 60 may be evaluated while maintaining one or more engine conditions 16 constant. Step 204 may be performed via an appropriate optimization routine. For example, step 204 may be performed by optimization routines such as Newton's method, gradient method, evolutionary algorithms, or other algorithms. If desired, a proprietary algorithm may be employed during step 204. When request 18 is a request for a maximum output, engine parameters 60 may be calculated by simulating, with engine simulation 20, sets of parameters 60 that correspond to different strategies for operating the engine to achieve maximum output without violating any of the constraints 14. The engine parameters 60 determined in step 204 may be included in a set, the set of parameters corresponding to commands for components of the actual engine to achieve engine output 62. These determined parameters 60 may specify, for example, at least one of: a start of injection (SOI), a start of injection pressure (SOIP), an amount of exhaust gas recirculation (EGR flow rate), or a fuel injection strategy (including strategies in which multiple injections are performed in a single engine cycle). The optimal set of parameters 60 (e.g., the set of parameters 60 that achieve maximum engine output without violating any constraints) may be stored in a memory of engine simulator 12. If desired, step 204 may include storing one or more items of performance information 64 associated with the determined parameters 60. Step 204 may be repeated while varying one or more engine conditions 16, such as engine speed condition 118, while maintaining an air pressure condition 116 constant. Accordingly, a plurality of sets of engine parameters 60 may be determined for different engine speed conditions (e.g., 1,000, 1,200, 1,400, or 2,000 or more RPM).

Step 206 may include determining whether to evaluate one or more additional engine conditions 16, such as an additional air pressure condition 116. For example, steps 202 and 204 may be performed with a first air pressure condition 102. When evaluating second 104, third 106, or additional air pressure conditions 116 is necessary or desired, the determination in step 206 may be positive, and a step 208 may be performed. Step 208 may include changing or setting the value of pressure condition 116 to a different value. Step 204 may then be performed while maintaining the value of condition 16 at the value changed or set in step 208. Second or subsequent repetitions of step 204 may result in the determination of second engine outputs 62 based on second or subsequent values of pressure condition 116.

When the determination in step 206 is negative, method 200 may proceed to a step 210 for programming or configuring engine control unit 80. For example, step 210 may include writing one or more engine parameters 60 (including one or more sets of optimal engine parameters 60) to memory 82 to create, supplement, and/or modify information for model 90. This may include supplementing (e.g., adding to) existing data or information, such as existing engine parameters and/or existing engine performance information stored in a memory of engine simulator 12 and/or supplementing existing engine performance information stored in memory 82 of engine control unit 80. This existing information, for example, may include data obtained with a physical test engine. When the programming of engine model 90 and engine control unit 80 is complete, engine control unit 80 may be connected to the actual internal combustion engine.

While method 200 has been described with respect to an intake air condition (air pressure condition 116), it is understood that method 200 may be performed with various engine conditions. Additionally, while one or more engine parameters 60 may be written to (stored in) memory 82 provided on an engine control unit 80, these parameters 60 may instead be written or stored in a memory of engine simulator 12. Engine parameters 60 stored in a memory of engine simulator 12 may be provided directly to control unit 80 (e.g., by communication between engine simulator 12 and engine control unit 80), or may be provided to one or more engine control units 80 via an intermediate device.

By calibrating or programming engine control unit 80 with use of an engine simulation 20, it may be possible to maximize acceleration performance with less physical testing of an actual internal combustion engine. Thus, the amount of time needed to calibrate or program the control unit 80 may be reduced. In particular, engine simulation 20 may assist with the creation of data for use with an engine model that would otherwise require extensive testing under conditions, such as intake air pressures, which may be difficult to reproduce in a controlled setting. Additionally, by setting, or forcing, a series of values of engine parameters, such as intake pressure conditions, it may be possible to optimize engine parameters such as start of injection timing (SOI), start of injection pressure (SOIP), exhaust gas recirculation (EGR) flow rates, and/or injection strategies, such as multiple injections. These optimized parameters may allow engine control unit 80 to maximize the torque output by the engine, without exceeding mechanical or emissions constraints, by providing the engine control unit 80 with data that may be challenging to gather using a physical test engine. By supplementing information obtained, for example, with a physical test engine, engine model 90 may be provided with information representative of a variety of engine conditions, in addition to conditions evaluated with a physical test engine. Parameters may be identified for various conditions that are difficult to reproduce with a physical internal combustion engine, such as an intake manifold absolute pressure. Simulation may allow for calibration of an engine control unit under a plurality of conditions that are difficult to simulate.

It will be apparent to those skilled in the art that various modifications and variations can be made to the disclosed method and system without departing from the scope of the disclosure. Other embodiments of the method and system will be apparent to those skilled in the art from consideration of the specification and practice of the method and system disclosed herein. It is intended that the specification and examples be considered as exemplary only, with a true scope of the disclosure being indicated by the following claims and their equivalents.

What is claimed is:

1. A method for generating data for an internal combustion engine model, the method comprising:
   receiving at least one emissions constraint by an internal combustion engine simulator;
   receiving a first set value of an intake manifold condition as an input to the internal combustion engine simulator;
   determining at least one simulated engine parameter associated with a maximum expected acceleration with the internal combustion engine simulator, wherein the at least one simulated engine parameter is determined based on at least the first set value and the at least one emissions constraint; and
   storing the at least one simulated engine parameter as a part of the data for the internal combustion engine model, the data for the internal combustion engine model including at least one existing engine parameter associated with a physical test engine.

2. The method of claim 1, wherein the maximum expected acceleration is determined without operating a physical internal combustion engine.

3. The method of claim 1, wherein the at least one simulated engine parameter includes a fuel delivery parameter.

4. The method of claim 3, wherein the fuel delivery parameter includes an injection timing or a number of injections of a single engine cycle.

5. The method of claim 1, wherein the at least one emissions constraint includes an expected quantity of a component of an exhaust emission.

6. The method of claim 1, wherein the at least one engine condition includes a speed of a simulated internal combustion engine.

7. The method of claim 1, further including programming an internal combustion engine control unit with the engine model and the data including the at least one simulated engine parameter.

8. A control unit programming system, comprising:
   at least one processor; and
   a memory storing instructions that, when executed by the at least one processor, cause the control unit programming system to:
      receive at least one constraint by a simulated internal combustion engine;
      receive a first value of an air condition of the simulated internal combustion engine, the air condition corresponding to a simulated intake manifold pressure of the simulated internal combustion engine;
      determine at least one simulated engine parameter associated with a maximum expected output of the simulated internal combustion engine, wherein the maximum expected output is determined based on the first value and the at least one constraint;
      receive a second value of the air condition of the simulated internal combustion engine;
      determine at least one additional simulated engine parameter associated with the maximum expected output of the simulated internal combustion engine, wherein the maximum expected output is determined based on the second value and the at least one constraint; and
      supplement existing engine information by storing the at least one simulated engine parameter together with at least one existing engine parameter.

9. The system of claim 8, wherein the internal combustion engine model includes a mean value model.

10. The system of claim 8, wherein the air condition includes an air pressure within a simulated intake manifold.

11. The system of claim 8, wherein the at least one simulated engine parameter includes a timing of a fuel injection or a number of fuel injections in a combustion cycle.

12. The system of claim 8, wherein the memory and the internal combustion engine model are stored in an internal combustion engine control unit.

13. The system of claim 8, wherein the at least one constraint includes an emissions constraint and the at least one simulated engine parameter includes a fuel injection parameter.

\* \* \* \* \*